United States Patent
Togashi et al.

(10) Patent No.: US 7,365,957 B2
(45) Date of Patent: Apr. 29, 2008

(54) CERAMIC CAPACITOR MOUNTING STRUCTURE AND CERAMIC CAPACITOR

(75) Inventors: Masaaki Togashi, Tokyo (JP); Kentaro Ushioda, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/703,171

(22) Filed: Feb. 7, 2007

(65) Prior Publication Data

US 2007/0188975 A1 Aug. 16, 2007

(30) Foreign Application Priority Data

Feb. 14, 2006 (JP) .......................... P2006-037026

(51) Int. Cl.
*H01G 4/228* (2006.01)
*H01G 2/20* (2006.01)

(52) U.S. Cl. ................................. 361/306.3; 361/308.1
(58) Field of Classification Search ................ 361/303, 361/306.1, 306.3, 308.1, 309–310
See application file for complete search history.

(56) References Cited

U.S. PATENT DOCUMENTS 4,346,429 A * 8/1982 DeMatos .................... 361/310
6,046,902 A * 4/2000 Nakagawa et al. ...... 361/306.1
6,288,887 B1 * 9/2001 Yoshida et al. .......... 361/306.1
6,473,291 B1 * 10/2002 Stevenson ................. 361/306.3
6,563,694 B2 * 5/2003 Kim et al. .................... 361/526
6,661,641 B2 * 12/2003 Moriwaki et al. ......... 361/308.1
6,903,920 B1 * 6/2005 Prymak .................... 361/321.2
6,958,899 B2 * 10/2005 Togashi et al. .............. 361/303
6,965,507 B2 * 11/2005 Togashi et al. .............. 361/303

FOREIGN PATENT DOCUMENTS

JP    A 2000-232030    8/2000

* cited by examiner

*Primary Examiner*—Eric Thomas
(74) *Attorney, Agent, or Firm*—Oliff & Berridge, PLC

(57) ABSTRACT

A ceramic capacitor comprises a ceramic sintered body, and first and second terminal electrodes formed on outer surfaces of the ceramic sintered body. The first terminal electrode is electrically connected to a land formed on a substrate through a first metal terminal. The first metal terminal has a first capacitor connecting portion mechanically connected to the first terminal electrode, a first terminal portion mechanically connected to the land, and a first intermediate portion electrically connecting the first capacitor connecting portion and the first terminal portion to each other. The first capacitor connecting portion of the first metal terminal is parallel to the substrate.

7 Claims, 5 Drawing Sheets

CERAMIC CAPACITOR MOUNTING STRUCTURE AND CERAMIC CAPACITOR

BACKGROUND OF THE INVENTION

1. Field of the Invention

The present invention relates to a ceramic capacitor mounting structure and a ceramic capacitor.

2. Related Background Art

When a voltage is applied to a ceramic capacitor, a mechanical distortion having a magnitude corresponding to the applied voltage occurs in the ceramic sintered body because of the electrostrictive effect of the ceramic. Consequently, a vibration occurs in the ceramic capacitor when an AC voltage is applied thereto. Such a vibration propagates to a substrate mounting the ceramic capacitor, which causes the problem of sounding in the substrate.

Therefore, for reducing the sounding of the substrate, a structure in which a pair of ceramic capacitors are mounted symmetrical to each other on the front and rear faces of the substrate with the substrate interposed therebetween has been considered (see Patent Document 1). The mounting structure described in Patent Document 1 mounts a pair of ceramic capacitors symmetrical to each other on the front and rear faces of the substrate with the substrate interposed therebetween, so that respective vibrations generated in the capacitors cancel each other out, thereby suppressing the sounding.

[Patent Document 1] Japanese Patent Application Laid-Open No. 2000-232030

SUMMARY OF THE INVENTION

In order for the ceramic capacitor mounting structure described in Patent Document 1 to reduce the sounding, however, ceramic capacitors must be mounted symmetrical to each other on both of the front and rear faces of the substrate. This limits the degree of freedom in designing the substrate for mounting the capacitors.

For eliminating the problem mentioned above, it is an object of the present invention to provide a ceramic capacitor mounting structure and a ceramic capacitor which can reduce the sounding generated from the substrate for mounting the capacitors without lowering the degree of freedom in designing the substrate.

The inventors diligently studied ceramic capacitor mounting structures and ceramic capacitors which can reduce the sounding generated from the substrate for mounting the capacitors without lowering the degree of freedom in designing the substrate and, as a result, have newly found that vibrations in directions parallel to the substrate dominate the sounding.

Therefore, the inventors have conceived a ceramic capacitor and its mounting structure which restrain vibrations in directions parallel to the substrate among vibrations of the ceramic capacitor from propagating to the substrate and make vibrations in directions perpendicular to the substrate mainly propagate to the substrate, thereby being able to reduce the sounding generated from the substrate.

For such a fact, Patent Document 1 gives no consideration to taking account of directions of vibrations transmitted to the substrate.

In view of such studies, the present invention provides a ceramic capacitor mounting structure for mounting a ceramic capacitor to a substrate formed with first and second land electrodes; the ceramic capacitor comprising a ceramic sintered body, first and second inner electrodes arranged so as to oppose each other with a ceramic interposed therebetween in the ceramic sintered body, a first terminal electrode electrically connected to the first inner electrode and formed on an outer surface of the ceramic sintered body, and a second terminal electrode electrically connected to the second inner electrode and formed on an outer surface of the ceramic sintered body; wherein the first terminal electrode is electrically connected to the first land electrode formed on the substrate through a first metal terminal; wherein the second terminal electrode is electrically connected to the second land electrode formed on the substrate; wherein the first metal terminal has a first capacitor connecting portion mechanically connected to the first terminal electrode, a first terminal portion mechanically connected to the first land electrode, and a first intermediate portion connecting the first capacitor connecting portion and the first terminal portion to each other; and wherein the first capacitor connecting portion of the first metal terminal is parallel to the substrate.

In the above-mentioned ceramic capacitor mounting structure, the first capacitor connecting portion of the first metal terminal is mechanically connected to the first terminal electrode of the ceramic capacitor and is parallel to the substrate. Therefore, vibrations of the ceramic capacitor transmitted to the substrate through the first metal terminal are mainly those in directions perpendicular to the substrate, while vibrations in directions parallel to the substrate are restrained from propagating to the substrate. As a result, the sounding generated from the substrate can be reduced. The ceramic capacitor is just mounted to the substrate through the metal terminal, whereby no new restrictions are needed when designing a substrate for mounting a capacitor.

The second terminal electrode may be electrically connected to the second land electrode formed on the substrate through a second metal terminal; the second metal terminal having a second capacitor connecting portion mechanically connected to the second terminal electrode, a second terminal portion mechanically connected to the second land electrode, and a second intermediate portion connecting the second capacitor connecting portion and the second terminal portion to each other, the second capacitor connecting portion of the second metal terminal being parallel to the substrate. The sounding can be lowered when the second terminal electrode of the ceramic capacitor is connected to the second land electrode on the substrate through the second metal terminal in the structure mentioned above.

Preferably, the first terminal portion of the first metal terminal is parallel to the substrate and has a portion opposing the first capacitor connecting portion when seen in a direction orthogonal to the substrate. When the first capacitor connecting portion and the first terminal portion oppose each other, the first metal terminal has an elastic force, and can absorb vibrations of the ceramic capacitor. As a result, the sounding generated from the substrate can be reduced more.

Alternatively, it will be preferred if the first terminal portion of the first metal terminal is parallel to the substrate and has a portion opposing the first capacitor connecting portion when seen in a direction orthogonal to the substrate, and the second terminal portion of the second metal terminal is parallel to the substrate and has a portion opposing the second capacitor connecting portion when seen in a direction orthogonal to the substrate. When the capacitor connecting portion and the terminal portions oppose each other, the first and second metal terminals have elastic forces and can absorb vibrations of the ceramic capacitor. As a result, the sounding generated from the substrate can be reduced more.

There may be a plurality of ceramic capacitors, the first terminal electrode of each ceramic capacitor being electrically connected to the first land electrode formed on the substrate through the first metal terminal, the second terminal electrode of each ceramic capacitor being mounted to the substrate by being electrically connected to the second land electrode formed on the substrate. Mounting a plurality of ceramic capacitors can yield a higher capacity. Each ceramic capacitor can reduce the sounding also when there are a plurality of ceramic capacitors.

The ceramic capacitor may be mounted to the substrate such that the first and second inner electrodes oppose each other in a direction parallel to the substrate. In the case of such mounting, vibrations in the opposing direction of the first and second inner electrodes are parallel to the capacitor connecting portion of the metal terminal and thus are hard to propagate through the metal terminal.

The ceramic capacitor in accordance with the present invention is a ceramic capacitor comprising a ceramic sintered body, first and second inner electrodes arranged so as to oppose each other with a ceramic interposed therebetween in the ceramic sintered body, a first terminal electrode electrically connected to the first inner electrode and formed on an outer surface of the ceramic sintered body, and a second terminal electrode electrically connected to the second inner electrode and formed on an outer surface of the ceramic sintered body; wherein a metal terminal is mechanically connected to the first terminal electrode; wherein the metal terminal has a capacitor connecting portion mechanically connected to the first terminal electrode, a terminal portion parallel to the capacitor connecting portion, and an intermediate portion electrically connecting the capacitor connecting portion and the terminal portion to each other; and wherein the ceramic capacitor is mountable to a substrate such that the capacitor connecting portion of the metal terminal is parallel to the substrate.

The above-mentioned ceramic capacitor can be mounted to the substrate such that the capacitor connecting portion of the metal terminal is parallel to the substrate. In this case, vibrations of the ceramic capacitor transmitted to the substrate through the metal terminal are mainly those in directions perpendicular to the substrate, whereby the sounding generated from the substrate can be reduced. Also, the ceramic capacitor can be mounted to the substrate through the metal terminal, whereby no new restrictions are needed when designing a substrate for mounting a capacitor.

The present invention can provide a ceramic capacitor mounting structure and a ceramic capacitor which can reduce the sounding generated from a substrate for mounting the capacitor without lowering the degree of freedom in designing the substrate.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

In the following, preferred embodiments of the present invention will be explained with reference to the accompanying drawings. In the explanation, the same constituents or those having the same functions will be referred to with the same numerals while omitting their overlapping descriptions. The ceramic capacitor mounting structures in accordance with these embodiments are described while incorporating the ceramic capacitor in accordance with the present invention.

First Embodiment

Figure 1:
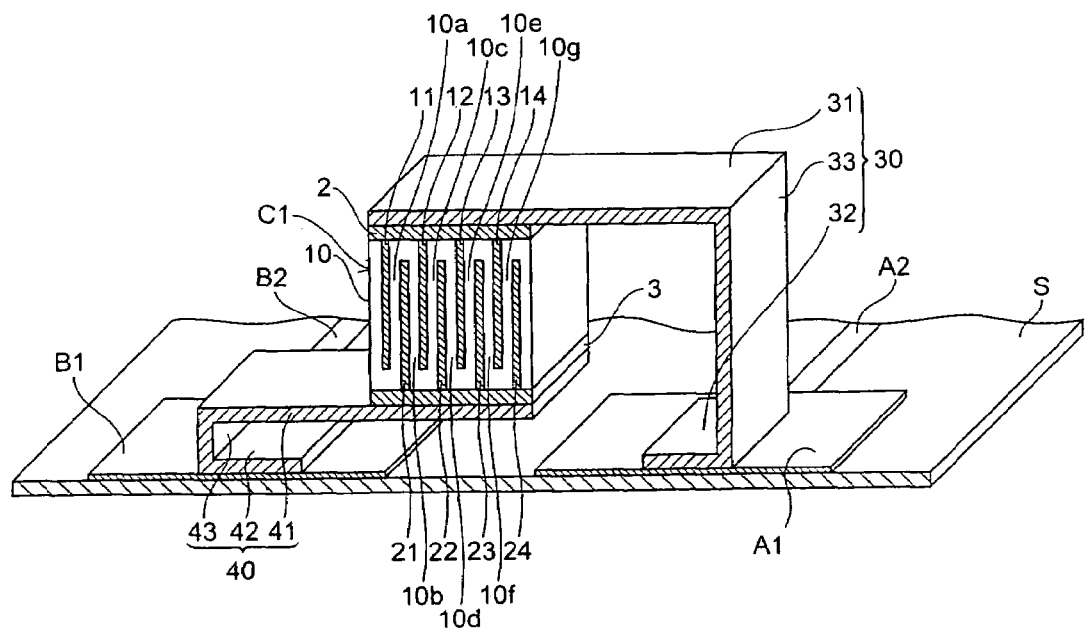
FIG. 1 is a cross-sectional perspective view showing a ceramic capacitor mounting structure in accordance with a first embodiment.

A ceramic capacitor mounting structure in accordance with a first embodiment will be explained with reference to FIG. 1. FIG. 1 is a cross-sectional perspective view showing a ceramic capacitor mounting structure in accordance with the first embodiment. FIG. 1 omits the hatching in the region corresponding to the ceramic within a ceramic sintered body 10.

In the ceramic capacitor mounting structure in accordance with the first embodiment, a ceramic capacitor C1 is mounted to a substrate S. A positive electrode land pattern A1 and a negative electrode land pattern B1 are formed on the substrate S. Leads A2 and B2 extend from the positive electrode land pattern (first land electrode) A1 and the negative electrode land pattern (second land electrode) B1, respectively.

The ceramic capacitor C1 comprises the ceramic sintered body 10, and first and second terminal electrodes 2, 3 which are formed on outer surfaces of the ceramic sintered body 10.

As shown in FIG. 1, the ceramic sintered body 10 includes a plurality of (4 each in this embodiment) first and second inner electrodes 11 to 14, 21 to 24. The first and second inner electrodes 11 to 14, 21 to 24 are arranged such as to oppose each other through ceramic layers 10a to 10g respectively.

Both of the outer surfaces of the ceramic sintered body 10 formed with the first terminal electrode 2 and second terminal electrode 3 are parallel to the opposing direction of the first and second inner electrodes 11 to 14, 21 to 24. Also, as shown in FIG. 1, the ceramic capacitor C1 is mounted to the substrate S such that the opposing direction of the first and second inner electrodes 11 to 14, 21 to 24 is parallel to the substrate S.

The first and second terminal electrodes 2, 3 are formed on respective outer surfaces of the ceramic sintered body 10 which oppose each other. The first terminal electrode 2 is electrically connected to the positive electrode land pattern A1 formed on the substrate S through a first metal terminal 30. The second terminal electrode 3 is electrically connected to the negative electrode land pattern B1 formed on the substrate S through a second metal terminal 40.

The first metal terminal 30 has a first capacitor connecting portion 31, a first terminal portion 32, and a first intermediate portion 33. The first capacitor connecting portion 31 is mechanically connected to the first terminal electrode 2 (more specifically, a surface of the first terminal electrode 2 which is parallel to the outer surface of the ceramic sintered body 10 formed with the first terminal electrode 2). The first capacitor connecting portion 31 is shaped like a plate parallel to the substrate S.

The first terminal portion 32 is mechanically connected to the positive electrode land pattern A1 formed on the substrate S. The first terminal portion 32 is shaped like a plate parallel to the substrate S, and opposes the first capacitor connecting portion 31 when seen in a direction orthogonal to the substrate S. Also, the first terminal portion 32 is parallel to both of the first capacitor connecting portion 31 and the substrate S. When the capacitor is mounted such that the first terminal portion 32 is connected to a land of the substrate S, the first capacitor connecting portion 31 is parallel to the substrate S.

The first intermediate portion 33 connects the first capacitor connecting portion 31 and the first terminal portion 32 to each other. Consequently, the first capacitor connecting portion 31 and the first terminal portion 32 are connected to each other electrically as well. The first intermediate portion 33 is shaped like a plate extending in a direction perpendicular to the substrate S, and connects one end of the first capacitor connecting portion 31 and one end of the first terminal portion 32 to each other.

The second metal terminal 40 has a second capacitor connecting portion 41, a second terminal portion 42, and a second intermediate portion 43. The second capacitor connecting portion 41 is mechanically connected to the second terminal electrode 3 (more specifically, a surface of the second terminal electrode 3 which is parallel to the outer surface of the ceramic sintered body 10 formed with the second terminal electrode 3). The second capacitor connecting portion 41 is shaped like a plate parallel to the substrate S.

The second terminal portion 42 is mechanically connected to the negative electrode land pattern B1 formed on the substrate S. The second terminal portion 42 is shaped like a plate parallel to the substrate S, and opposes the second capacitor connecting portion 41 when seen in a direction orthogonal to the substrate S. Also, the second terminal portion 42 is parallel to both of the second capacitor connecting portion 41 and the substrate S. When the capacitor is mounted such that the second terminal portion 42 is connected to a land of the substrate S, the second capacitor connecting portion 41 is parallel to the substrate S.

The second intermediate portion 43 connects the second capacitor connecting portion 41 and the second terminal portion 42 to each other. Consequently, the second capacitor connecting portion 41 and the second terminal portion 42 are connected to each other electrically as well. The second intermediate portion 43 is shaped like a plate extending in a direction perpendicular to the substrate S, and connects one end of the second capacitor connecting portion 41 and one end of the second terminal portion 42 to each other.

In the ceramic capacitor mounting structure in accordance with the first embodiment, the first capacitor connecting portion 31 of the first metal terminal 30 is mechanically connected to the first terminal electrode 2 of the ceramic capacitor C1. The first capacitor connecting portion 31 of the first metal terminal 30 and the substrate S are parallel to each other. Therefore, even when the ceramic capacitor C1 is vibrated by a voltage applied thereto, vibrations transmitted from the first terminal electrode 2 to the substrate S through the first metal terminal 30 are mainly those in directions perpendicular to the substrate S. Also, since the first capacitor connecting portion 31 of the first metal terminal 30 is parallel to the substrate S, vibrations in directions parallel to the substrate S are restrained from being transmitted to the substrate S through the first metal terminal 30. Since vibrations dominating the sounding of the substrate are those in directions parallel to the substrate, the ceramic capacitor mounting structure in accordance with the first embodiment can reduce the sounding generated from the substrate S.

In the ceramic capacitor mounting structure in accordance with the first embodiment, the second capacitor connecting portion 41 of the second metal terminal 40 is mechanically connected to the second terminal electrode 3 of the ceramic capacitor C1. Since the second capacitor connecting portion 41 of the second metal terminal 40 is parallel to the substrate S, vibrations transmitted to the substrate S through the second metal terminal 40 among vibrations of the ceramic capacitor C1 are mainly those in directions perpendicular to the substrate S. Also, since the second capacitor connecting portion 41 of the second metal terminal 40 is parallel to the substrate S, vibrations in directions parallel to the substrate S are restrained from being transmitted to the substrate S through the second metal terminal 40. Consequently, vibrations transmitted from the second terminal electrode 3 through the metal terminal 4 are those in directions perpendicular to the substrate S. Therefore, the sounding generated from the substrate S can also be reduced with regard to the connection between the second terminal electrode 3 and the substrate S.

Since the sounding is reduced through metal terminals while devising how to connect them, the mounting structure in accordance with this embodiment is effective in mounting capacitors to soft substrates (e.g., flexible substrates and glass-epoxy substrates).

The ceramic capacitor C1 is just mounted to the substrate S through the metal terminals 30, 40, whereby there is no need to provide new restrictions when designing the substrate S. Therefore, the ceramic capacitor mounting structure in accordance with the first embodiment can reduce the sounding without lowering the degree of freedom in designing.

The first terminal portion 32 of the first metal terminal 30 is parallel to the substrate S, and opposes the first capacitor connecting portion 31 when seen in a direction orthogonal to the substrate S. Also, the second terminal portion 42 of the second metal terminal 40 is parallel to the substrate S, and opposes the second capacitor connecting portion 41 when seen in a direction orthogonal to the substrate S. Since the capacitor connecting portions 31, 41 oppose their corresponding terminal portions 32, 42, the first and second metal terminals 30, 40 have elastic forces. These elastic forces absorb vibrations of the ceramic capacitor C1. As a result, the sounding generated from the substrate S can be reduced more.

The ceramic capacitor C1 is mounted to the substrate S such that the opposing direction of the first and second inner electrodes 11 to 14, 21 to 24 is parallel to the substrate S. In the case of such mounting, vibrations in the opposing direction of the first and second inner electrodes 11 to 14, 21 to 24 are parallel to the capacitor connecting portions 31, 41 of the first and second metal terminals 30, 40. Consequently, vibrations in the opposing direction of the first and second inner electrodes 11 to 14, 21 to 24 are hard to propagate through the metal terminals.

Figure 2:
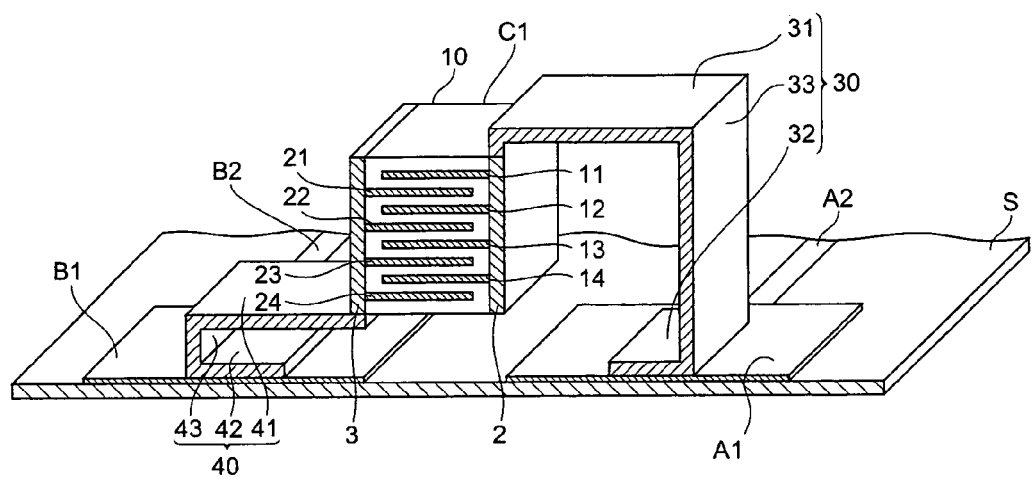
FIG. 2 is a cross-sectional perspective view showing a first modified example of the ceramic capacitor mounting structure in accordance with the first embodiment.
Figure 3:
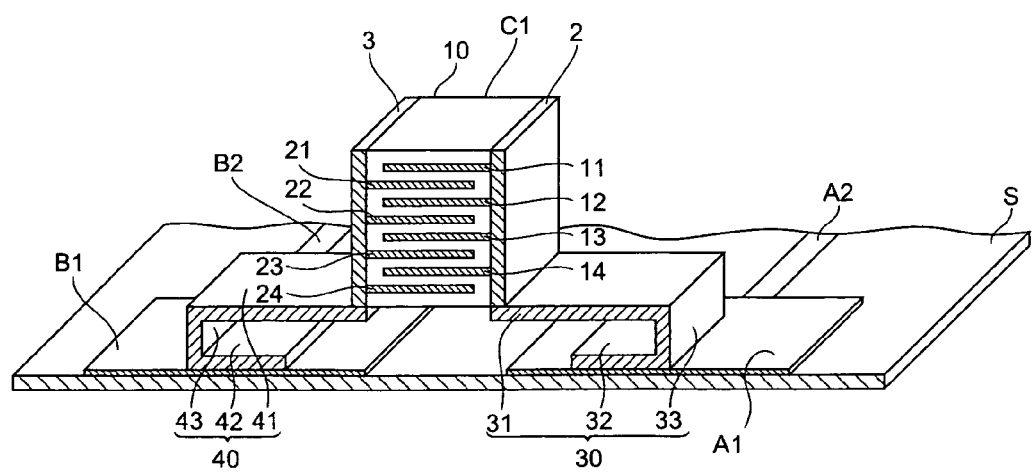
FIG. 3 is a cross-sectional perspective view showing a second modified example of the ceramic capacitor mounting structure in accordance with the first embodiment.

FIGS. 2 and 3 show cross-sectional perspective views of first and second modified examples of the ceramic capacitor mounting structure in accordance with the first embodiment, respectively. The ceramic capacitor mounting structures in accordance with the first and second modified examples differ from the mounting structure in accordance with the first embodiment in that the ceramic capacitor C1 is mounted such that the opposing direction of the first and second inner electrodes 11 to 14, 21 to 24 is orthogonal to the substrate S. In the first and second modified examples, respective surfaces of the first and second terminal electrodes positioned at ends in the opposing direction of the first and second inner electrodes 11 to 14, 21 to 24 are mechanically connected to the capacitor connecting portions of the metal terminals 30, 40. As shown in the first and second modified examples, the capacitor connecting portion of the metal terminal 30 may be connected to any of the two surfaces of the first terminal electrode positioned at both ends in the opposing direction of the first and second inner electrodes 11 to 14, 21 to 24. As shown in the first and second modified examples, the capacitor connecting portion of the metal terminal 40 may be connected to any of the two surfaces of the second terminal electrode positioned at both ends in the opposing direction of the first and second inner electrodes 11 to 14, 21 to 24. Since the capacitor connecting portions of the metal terminals connected to the terminal electrodes of the ceramic capacitor are parallel to the substrate S, the sounding of the substrate can be reduced in the first and second modified examples as well.

FIGS. 2 and 3 omit the hatching in the region corresponding to the ceramic within the ceramic sintered body.

Second Embodiment

Figure 4:
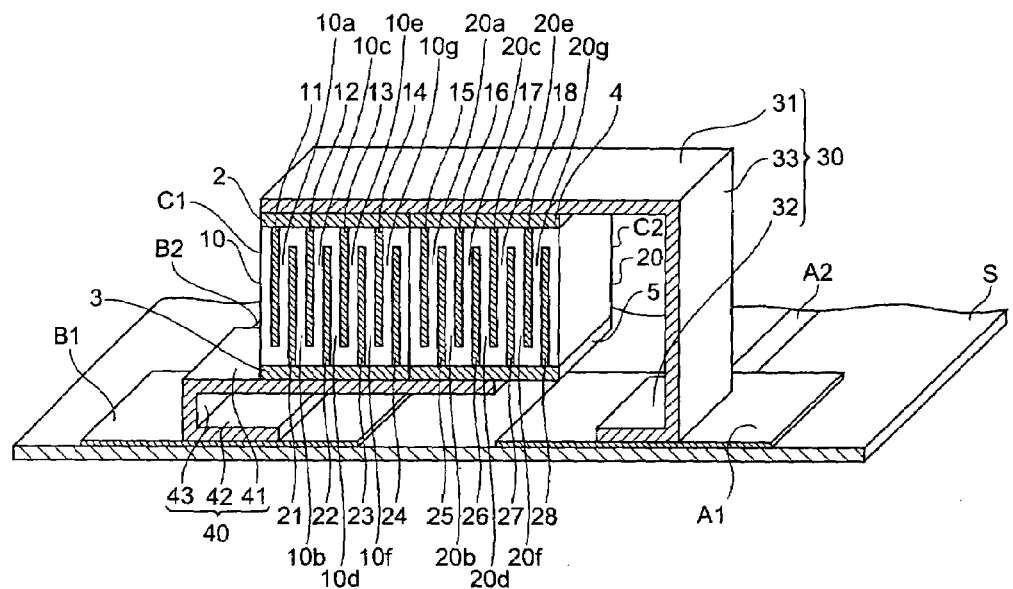
FIG. 4 is a cross-sectional perspective view showing a ceramic capacitor mounting structure in accordance with a second embodiment.

With reference to FIG. 4, a ceramic capacitor mounting structure in accordance with a second embodiment will be explained. The ceramic capacitor mounting structure in accordance with the second embodiment differs from the mounting structure for the ceramic capacitor C1 in accordance with the first embodiment in terms of the number of ceramic capacitors mounted to the substrate S. FIG. 4 is a cross-sectional perspective view showing the ceramic capacitor mounting structure in accordance with the second embodiment. FIG. 4 omits the hatching in the regions corresponding to the ceramics within the ceramic sintered bodies 10, 20.

In the ceramic capacitor mounting structure in accordance with the second embodiment, a plurality of (2 in this embodiment) ceramic capacitors C1, C2 are mounted to the substrate S. The ceramic capacitor C2 comprises a ceramic sintered body 20 and a plurality of (2 in this embodiment) terminal electrodes 4, 5 formed on two different outer surfaces of the ceramic sintered body 20.

As shown in FIG. 4, a plurality of (4 in this embodiment) first and second inner electrodes 15 to 18, 25 to 28 are included in the ceramic sintered body 20. The first and second inner electrodes 15 to 18, 25 to 28 are arranged such as to oppose each other through ceramic layers 20a to 20g respectively.

Each of the respective outer surfaces of the ceramic sintered body 20 formed with the first terminal electrode 4 and second terminal electrode 5 is parallel to the opposing direction of the first and second inner electrodes 15 to 18, 25 to 28. Also, as shown in FIG. 4, each of the ceramic capacitors C1, C2 is mounted to the substrate S such that the opposing direction of the first and second inner electrodes 11 to 14, 21 to 24, 15 to 18, 25 to 28 is parallel to the substrate S.

The first and second terminal electrodes 4, 5 are formed on respective outer surfaces of the ceramic sintered body 20 which oppose each other.

The first terminal electrode of each ceramic capacitor is electrically connected to a first land electrode formed on the substrate through a first metal terminal.

The respective first terminal electrodes 2, 4 of the ceramic capacitors C1, C2 are electrically connected to a positive electrode land pattern A1 formed on the substrate S through a first metal terminal 30. The respective second terminal electrodes 3, 5 of the ceramic capacitors C1, C2 are electrically connected to a negative electrode land pattern B1 formed on the substrate S through a second metal terminal 40.

Namely, the first capacitor connecting portion 31 of the first metal terminal 30 is mechanically connected to both of the first terminal electrode 2 of the ceramic capacitor C1 and the first terminal electrode 4 of the ceramic capacitor C2. On the other hand, the second capacitor connecting portion 41 of the second metal terminal 40 is mechanically connected to both of the second terminal electrode 3 of the ceramic capacitor C1 and the second terminal electrode 5 of the ceramic capacitor C2.

The first metal terminal 30 has the first capacitor connecting portion 31, first terminal portion 32, and first intermediate portion 33. The first capacitor connecting portion 31 is mechanically connected to the first terminal electrodes 2, 4. The first capacitor connecting portion 31 is shaped like a plate parallel to the substrate S. The first terminal portion 32 is mechanically connected to the positive electrode land pattern A1 formed on the substrate S. The first terminal portion 32 is shaped like a plate parallel to the substrate S, and opposes the first capacitor connecting portion 31 when seen in a direction orthogonal to the substrate S. The first intermediate portion 33 is electrically connected to one end of the first capacitor connecting portion 31 and one end of the first terminal portion 32, thereby connecting the first capacitor connecting portion 31 and the first terminal portion 32 to each other mechanically and electrically.

The second metal terminal 40 has the second capacitor connecting portion 41, second terminal portion 42, and second intermediate portion 43. The second capacitor connecting portion 41 is mechanically connected to the second terminal electrodes 3, 5. The second capacitor connecting portion 41 is shaped like a plate parallel to the substrate S. The second terminal portion 42 is mechanically connected to the negative electrode land pattern B1 formed on the substrate S. The second terminal portion 42 is shaped like a plate parallel to the substrate S, and opposes the second capacitor connecting portion 42 when seen in a direction orthogonal to the substrate S. The second intermediate portion 43 is electrically connected to one end of the second capacitor connecting portion 41 and one end of the second terminal portion 42, thereby connecting the second capacitor connecting portion 41 and the second terminal portion 42 to each other mechanically and electrically.

In the ceramic capacitor mounting structure in accordance with the second embodiment, the first capacitor connecting portion 31 of the first metal terminal 30 is mechanically connected to the first terminal electrodes 2, 4 of the ceramic capacitors C1, C2. Since the first capacitor connecting portion 31 of the first metal terminal 30 and the substrate S are parallel to each other, vibrations of the ceramic capacitors C1, C2 transmitted from the first terminal electrodes 2, 4 to the substrate S through the first metal terminal 30 are mainly those in directions perpendicular to the substrate S, whereby vibrations in directions parallel to the substrate S are restrained from being transmitted to the substrate S through the first metal terminal 30. Since vibrations dominating the sounding of the substrate S are those in directions parallel to the substrate S, the ceramic capacitor mounting structure in accordance with the second embodiment can reduce the sounding generated from the substrate S.

In the ceramic capacitor mounting structure in accordance with the second embodiment, the second capacitor connecting portion 41 of the second metal terminal 40 mechanically connected to the second terminal electrodes 3, 5 of the ceramic capacitors C1, C2 is parallel to the substrate S. Consequently, vibrations of the ceramic capacitors C1, C2 transmitted to the substrate S through the second metal terminal 40 are mainly those in directions perpendicular to the substrate S. Therefore, the sounding generated from the substrate S can also be reduced with regard to the second terminal electrodes 3, 5.

The ceramic capacitors C1, C2 are just mounted to the substrate S through the metal terminals 30, 40, whereby there is no need to provide new restrictions when designing the substrate S. Therefore, the ceramic capacitor mounting structure in accordance with the second embodiment can reduce the sounding without lowering the degree of freedom in designing.

The first capacitor connecting portion 31 and first terminal portion 32 of the first metal terminal 30 oppose each other when seen in a direction orthogonal to the substrate S. The second capacitor connecting portion 41 and second terminal portion 42 of the second metal terminal 40 oppose each other when seen in a direction orthogonal to the substrate S. Therefore, the first and second metal terminals 30, 40 have elastic forces, and absorb vibrations of the ceramic capacitors C1, C2. As a result, the sounding generated from the substrate S can be reduced more.

The ceramic capacitors C1, C2 are mounted to the substrate S such that the opposing direction of the first and second inner electrodes 11 to 14, 21 to 24, 15 to 18, 25 to 28 is parallel to the substrate S. In the case of such mounting, vibrations in the opposing direction of the first and second inner electrodes 11 to 14, 21 to 24, 15 to 18, 25 to 28 are parallel to the capacitor connecting portions 31, 41 of the first and second metal terminals 30, 40, and thus are hard to propagate through the metal terminals.

The ceramic capacitor mounting structure in accordance with the second embodiment mounts a plurality of ceramic capacitors C1, C2, and thus can yield a higher capacity.

Third Embodiment

Figure 5:
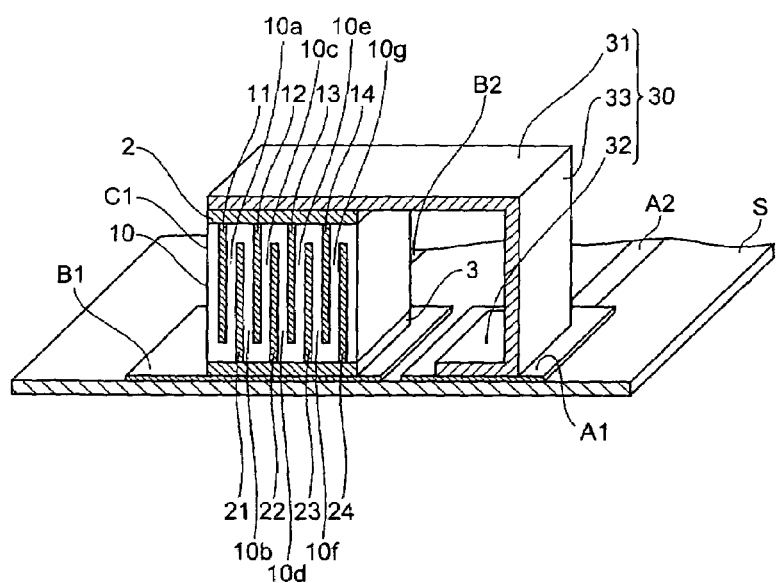
FIG. 5 is a cross-sectional perspective view showing a ceramic capacitor mounting structure in accordance with a third embodiment.

A ceramic capacitor mounting structure in accordance with a third embodiment will be explained with reference to FIG. 5. The ceramic capacitor mounting structure in accordance with the third embodiment differs from the mounting structure for the ceramic capacitor C1 in accordance with the first embodiment in terms of the number of terminal electrodes connected to the substrate through metal terminals. FIG. 5 is a cross-sectional perspective view showing the ceramic capacitor mounting structure in accordance with the third embodiment. FIG. 5 omits the hatching in the region corresponding to the ceramic within a ceramic sintered body 10.

In the ceramic capacitor mounting structure in accordance with the third embodiment, a ceramic capacitor C1 is mounted to a substrate S.

A first terminal electrode 2 of the ceramic capacitor C1 is electrically connected to a positive electrode land pattern A1 on the substrate S through a first metal terminal 30 connected onto the substrate S. A second terminal electrode 3 of the ceramic capacitor C1 is mechanically connected to a negative electrode land pattern B1 on the substrate S, and thus is electrically connected to the negative electrode land pattern B1.

The first metal terminal 30 has a first capacitor connecting portion 31, a first terminal portion 32, and a first intermediate portion 33. The first capacitor connecting portion 31 is mechanically connected to the first terminal electrode 2. The first capacitor connecting portion 31 is shaped like a plate parallel to the substrate S. The first terminal portion 32 is mechanically connected to the positive electrode land pattern A1 formed on the substrate S. The first terminal portion 32 is shaped like a plate parallel to the substrate S, and opposes the first capacitor connecting portion 31 when seen in a direction orthogonal to the substrate S. The first intermediate portion 33 is mechanically connected to one end of the first capacitor connecting portion 31 and one end of the first terminal portion 32, thereby connecting the first capacitor connecting portion 31 and first terminal portion 32 to each other. Consequently, the first capacitor connecting portion 31 and the first terminal portion 32 are electrically connected to each other.

In the ceramic capacitor mounting structure in accordance with the third embodiment, the first capacitor connecting portion 31 of the first metal terminal 30 is mechanically connected to the first terminal electrode 2 of the ceramic capacitor C1. Since the first capacitor connecting portion 31 of the first metal terminal 30 and the substrate S are parallel to each other, vibrations of the ceramic capacitor C1 transmitted from the first terminal electrode 2 to the substrate S through the first metal terminal 30 are mainly those in directions perpendicular to the substrate S, whereas vibrations in directions parallel to the substrate S are restrained from propagating to the substrate S through the first metal terminal 30. Since vibrations dominating the sounding of the substrate S are those in directions parallel to the substrate S, the ceramic capacitor mounting structure in accordance with the third embodiment can reduce the sounding generated from the substrate S.

The ceramic capacitor C1 is just mounted to the substrate S through the metal terminal 30, whereby there is no need to provide new restrictions when designing the substrate S. Therefore, the ceramic capacitor mounting structure in accordance with the third embodiment can reduce the sounding without lowering the degree of freedom in designing.

The first capacitor connecting portion 31 and first terminal portion 32 of the first metal terminal 30 oppose each other when seen in a direction orthogonal to the substrate S. Therefore, the first metal terminal 30 has an elastic force, and absorbs vibrations of the ceramic capacitor C1. As a result, the sounding generated from the substrate S can be reduced more.

The ceramic capacitor C1 is mounted to the substrate S such that the opposing direction of first and second inner electrodes 11 to 14, 21 to 24 is parallel to the substrate S. In the case of such mounting, vibrations in the opposing direction of the first and second inner electrodes 11 to 14, 21 to 24 are parallel to the first capacitor connecting portion 31 of the first metal terminal 30, and thus are hard to propagate through the metal terminal.

Fourth Embodiment

Figure 6:
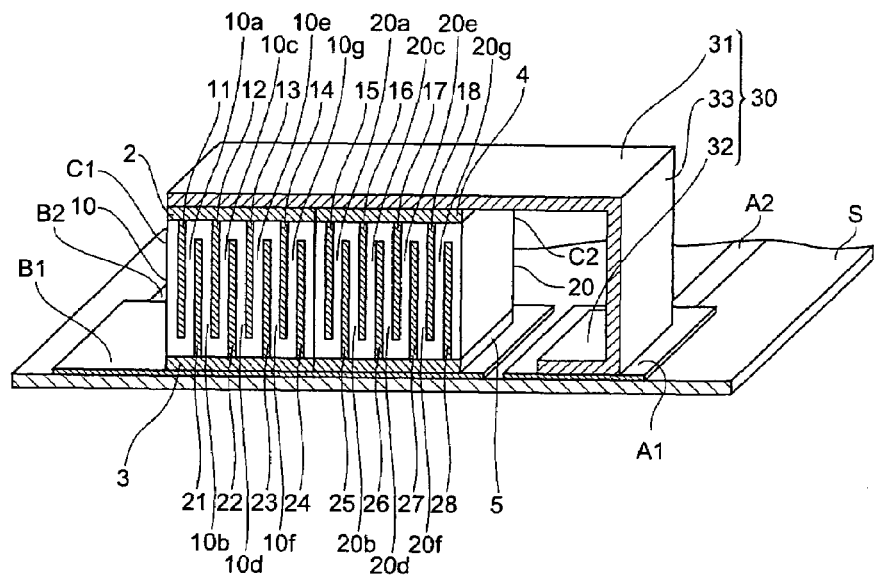
FIG. 6 is a cross-sectional perspective view showing a ceramic capacitor mounting structure in accordance with a fourth embodiment.

A ceramic capacitor mounting structure in accordance with a fourth embodiment will be explained with reference to FIG. 6. The ceramic capacitor mounting structure in accordance with the fourth embodiment differs from the mounting structure for the ceramic capacitor C1 in accordance with the third embodiment in terms of the number of ceramic capacitors mounted to the substrate S. FIG. 6 is a cross-sectional perspective view showing the ceramic capacitor mounting structure in accordance with the fourth embodiment. FIG. 6 omits the hatching in the regions corresponding to the ceramics within ceramic sintered bodies 10, 20.

In the ceramic capacitor mounting structure in accordance with the fourth embodiment, a plurality of (2 in this embodiment) ceramic capacitors C1, C2 are mounted to the substrate S. Respective first terminal electrodes 2, 4 of the ceramic capacitors C1, C2 are electrically connected to a positive electrode land pattern A1 formed on the substrate S through a first metal terminal 30. The first capacitor connecting portion 31 of the first metal terminal 30 is mechanically connected to both of the first terminal electrodes 2, 4 of the ceramic capacitors C1, C2.

Respective second terminal electrodes 3, 5 of the ceramic capacitors C1, C2 are mechanically connected to a negative electrode land pattern B1 formed on the substrate S, and thus are electrically connected to the negative electrode land pattern B1.

The first metal terminal 30 has a first capacitor connecting portion 31, a first terminal portion 32, and a first intermediate portion 33. The first capacitor connecting portion 31 is mechanically connected to the first terminal electrodes 2, 4. The first capacitor connecting portion 31 is shaped like a plate parallel to the substrate S. The first terminal portion 32 is mechanically connected to the positive electrode land pattern A1 formed on the substrate S. The first terminal portion 32 is shaped like a plate parallel to the substrate S, and opposes the first capacitor connecting portion 31 when seen in a direction orthogonal to the substrate S. The first intermediate portion 33 is mechanically connected to one end of the first capacitor connecting portion 31 and one end of the first terminal portion 32, thereby connecting the first capacitor connecting portion 31 and first terminal portion 32 to each other mechanically and electrically.

In the ceramic capacitor mounting structure in accordance with the fourth embodiment, the first capacitor connecting portion 31 of the first metal terminal 30 is mechanically connected to the first terminal electrodes 2, 4 of the ceramic capacitors C1, C2. Since the first capacitor connecting portion 31 of the first metal terminal 30 and the substrate S are parallel to each other, vibrations of the ceramic capacitor C1 transmitted from the first terminal electrode 2 to the substrate S through the first metal terminal 30 are mainly those in directions perpendicular to the substrate S, whereas vibrations in directions parallel to the substrate S are restrained from propagating to the substrate S through the first metal terminal 30. Since vibrations dominating the sounding of the substrate S are those in directions parallel to the substrate S, the ceramic capacitor mounting structure in accordance with the fourth embodiment can reduce the sounding generated from the substrate S.

The ceramic capacitors C1, C2 are just mounted to the substrate S through the metal terminal 30, whereby there is no need to provide new restrictions when designing the substrate S. Therefore, the ceramic capacitor mounting structure in accordance with the fourth embodiment can reduce the sounding without lowering the degree of freedom in designing.

The first capacitor connecting portion 31 and first connecting portion 32 of the first metal terminal 30 oppose each other when seen in a direction orthogonal to the substrate S. Therefore, the first metal terminal 30 has an elastic force, and absorbs vibrations of the ceramic capacitors C1, C2. As a result, the sounding generated from the substrate S can be reduced more.

The ceramic capacitors C1, C2 are mounted to the substrate S such that the opposing direction of first and second inner electrodes 11 to 14, 21 to 24, 15 to 18, 25 to 28 is parallel to the substrate S. In the case of such mounting, vibrations in the opposing direction of the first and second inner electrodes 11 to 14, 21 to 24, 15 to 18, 25 to 28 are parallel to the capacitor connecting portion 31 of the first metal terminal 30, and thus are hard to propagate through the metal terminal.

The ceramic capacitor mounting structure in accordance with the fourth embodiment mounts a plurality of ceramic capacitors C1, C2, and thus can yield a higher capacity.

Fifth Embodiment

Figure 7:
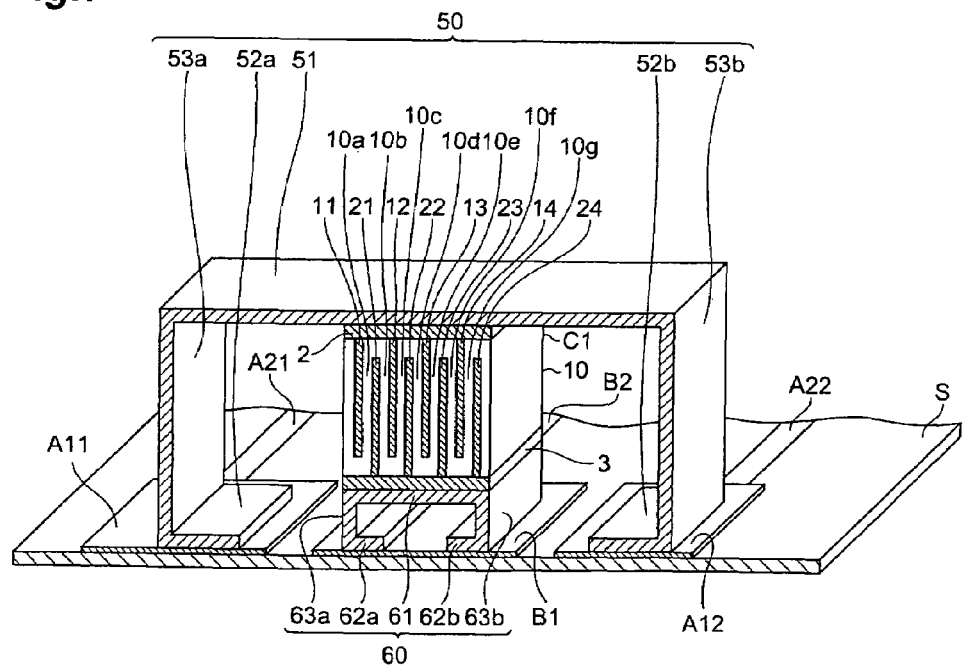
FIG. 7 is a cross-sectional perspective view showing a ceramic capacitor mounting structure in accordance with a fifth embodiment.

A ceramic capacitor mounting structure in accordance with a fifth embodiment will be explained with reference to FIG. 7. FIG. 7 is a cross-sectional perspective view showing the ceramic capacitor mounting structure in accordance with the fifth embodiment. FIG. 7 omits the hatching in the region corresponding to the ceramic within a ceramic sintered body 10.

In the ceramic capacitor mounting structure in accordance with the fifth embodiment, a ceramic capacitor C1 is mounted to a substrate S. Positive electrode land patterns A11, A12 and a negative electrode land pattern B1 are formed on the substrate S. The positive electrode land patterns A11, A12 are positioned so as to hold the negative electrode land pattern B1 therebetween. Leads A21, A22, and B2 extend from the positive electrode land patterns (first lands) A11, A12, and the negative electrode land pattern (second land) B1, respectively.

A first terminal electrode 2 of the ceramic capacitor C1 is electrically connected to the positive electrode land patterns A11, A12 formed on the substrate S through a first metal terminal 50. A second terminal electrode 3 of the ceramic capacitor C1 is electrically connected to the negative electrode land pattern B1 formed on the substrate S through a second metal terminal 60.

The first metal terminal 50 has a first capacitor connecting portion 51, first terminal portions 52a, 52b, and first intermediate portions 53a, 53b. The first capacitor connecting portion 51 is mechanically connected to the first terminal electrode 2. The first capacitor connecting portion 51 is shaped like a plate parallel to the substrate S.

The first terminal portions 52a, 52b are mechanically connected to the positive electrode land patterns A11, A12 formed on the substrate S, respectively. Each of the first terminal portions 52a, 52b is shaped like a plate parallel to the substrate S, and opposes the first capacitor connecting portion 51 when seen in a direction orthogonal to the substrate S. The first terminal portions 52a, 52b are parallel to both of the first capacitor connecting portion 51 and the substrate S. When the capacitor is mounted such that the first terminal portions 52a, 52b are connected to lands of the substrate S, the first capacitor connecting portion 51 is parallel to the substrate S.

The first intermediate portions 53a, 53b connect the first capacitor connecting portion 51 to the first terminal portions 52a, 52b, respectively. Consequently, the first capacitor connecting portion 51 is electrically connected to the first terminal portions 52a, 52b. Each of the first intermediate portions 53a, 53b is shaped like a plate extending in a direction perpendicular to the substrate S. The first intermediate portion 53a connects one end of the first capacitor connecting portion 51 and one end of the first terminal portion 52a to each other. The first intermediate portion 53b connects the other end of the first capacitor connecting portion 51 and one end of the first terminal portion 52b to each other.

The second metal terminal 60 has a second capacitor connecting portion 61, second terminal portions 62a, 62b, and second intermediate portions 63a, 63b. The second capacitor connecting portion 61 is mechanically connected to the second terminal electrode 3. The second capacitor connecting portion 61 is shaped like a plate parallel to the substrate S.

The second terminal portions 62a, 62b are mechanically connected to the negative electrode land pattern B1 formed on the substrate S. The second terminal portions 62a, 62b are formed like plates parallel to the substrate S, and oppose the second capacitor connecting portion 61 when seen in a direction orthogonal to the substrate S. Each of the second terminal portions 62a, 62b is parallel to both of the second capacitor connecting portion 61 and the substrate S. When the capacitor is mounted such that the second terminal portions 62a, 62b are connected to lands of the substrate S, the second capacitor connecting portion 61 is parallel to the substrate S.

The second intermediate portions 63a, 63b electrically connect the second capacitor connecting portion 61 to the second terminal portions 62a, 62b, respectively. Each of the second intermediate portions 63a, 63b is shaped like a plate extending in a direction perpendicular to the substrate S. The second intermediate portion 63a connects one end of the second capacitor connecting portion 61 and one end of the second terminal portion 62a to each other. The second intermediate portion 63b connects the other end of the second capacitor connecting portion 61 and one end of the second terminal portion 62b to each other.

In the ceramic capacitor mounting structure in accordance with the fifth embodiment, the first capacitor connecting portion 51 of the first metal terminal 50 is mechanically connected to the first terminal electrode 2 of the ceramic capacitor C1. Since the first capacitor connecting portion 51 of the first metal terminal 50 and the substrate S are parallel to each other, vibrations of the ceramic capacitor C1 transmitted from the first terminal electrode 2 to the substrate S through the first metal terminal 50 are mainly those in directions perpendicular to the substrate S, whereas vibrations in directions parallel to the substrate S are restrained from propagating to the substrate S through the first metal terminal 50. Since vibrations dominating the sounding of the substrate S are those in directions parallel to the substrate S, the ceramic capacitor mounting structure in accordance with the fifth embodiment can reduce the sounding generated from the substrate S.

In the ceramic capacitor mounting structure in accordance with the fifth embodiment, the second capacitor connecting portion 61 of the second metal terminal 60 mechanically connected to the second terminal electrode 3 of the ceramic capacitor C1 is parallel to the substrate S. Therefore, vibrations of the ceramic capacitor C1 transmitted to the substrate S through the second metal terminal 60 are mainly those in directions perpendicular to the substrate S. Hence, the sounding generated from the substrate S can also be reduced with regard to the second terminal electrode 3.

The ceramic capacitor C1 is just mounted to the substrate S through the metal terminals 50, 60, whereby there is no need to provide new restrictions when designing the substrate S. Therefore, the ceramic capacitor mounting structure in accordance with the fifth embodiment can reduce the sounding without lowering the degree of freedom in designing.

The first capacitor connecting portion 51 and first terminal portions 52a, 52b of the first metal terminal 50 oppose each other when seen in a direction orthogonal to the substrate S. The second capacitor connecting portion 61 and second terminal portions 62a, 62b of the second metal terminal 60 oppose each other when seen in a direction orthogonal to the substrate S. Therefore, the first and second metal terminals 50, 60 have elastic forces, and absorb vibrations of the ceramic capacitor C1. As a result, the sounding generated from the substrate S can be reduced more.

The ceramic capacitor C1 is mounted to the substrate S such that the opposing direction of first and second inner electrodes 11 to 14, 21 to 24 is parallel to the substrate S. In the case of such mounting, vibrations in the opposing direction of the first and second inner electrodes 11 to 14, 21 to 24 are parallel to the capacitor connecting portions 51, 61 of the first and second metal terminals 50, 60, and thus are hard to propagate through the metal terminals.

Sixth Embodiment

Figure 8:
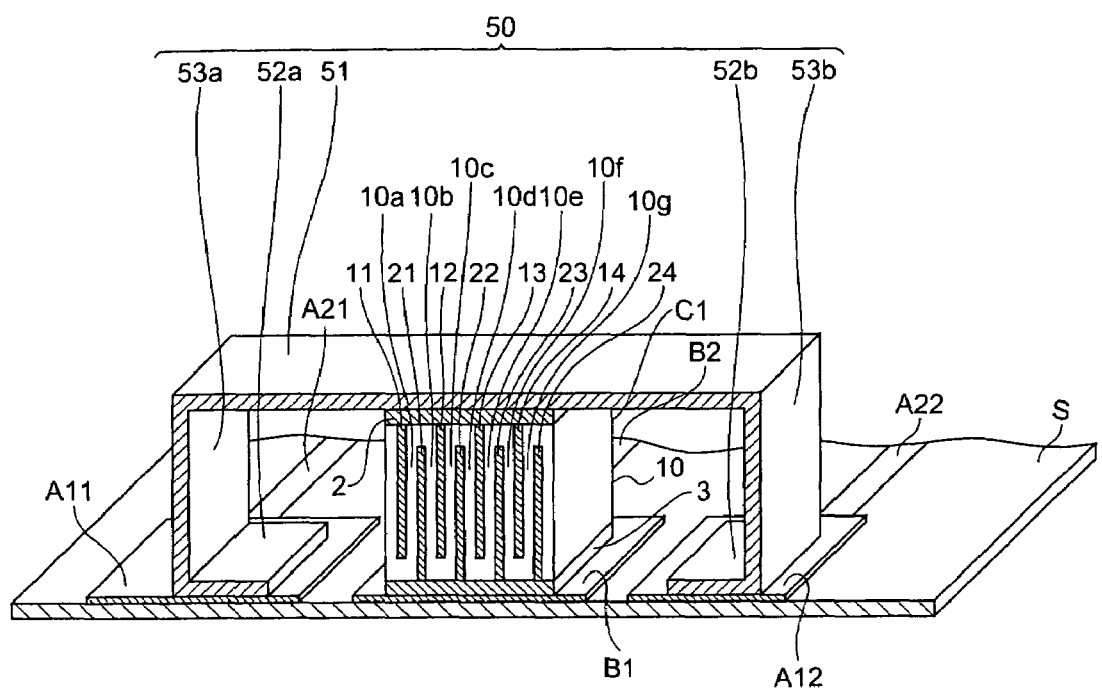
FIG. 8 is a cross-sectional perspective view showing a ceramic capacitor mounting structure in accordance with a sixth embodiment.

A ceramic capacitor mounting structure in accordance with a sixth embodiment will be explained with reference to FIG. 8. The ceramic capacitor mounting structure in accordance with the sixth embodiment differs from the mounting structure for the ceramic capacitor C1 in accordance with the fifth embodiment in terms of the number of terminal electrodes connected to the substrate through metal terminals. FIG. 8 is a cross-sectional perspective view showing the ceramic capacitor mounting structure in accordance with the sixth embodiment. FIG. 8 omits the hatching in the region corresponding to the ceramic within the ceramic sintered body 10.

In the ceramic capacitor mounting structure in accordance with the sixth embodiment, a ceramic capacitor C1 is mounted to a substrate S. Positive electrode land patterns A11, A12 and a negative electrode land pattern B1 are formed on the substrate S.

A first terminal electrode 2 of the ceramic capacitor C1 is electrically connected to the positive electrode land patterns A11, A12 on the substrate S through a first metal terminal 50 connected onto the substrate S. A second terminal electrode 3 of the ceramic capacitor C1 is mechanically connected to the negative electrode land pattern B1 on the substrate S, and thus is electrically connected to the negative electrode land pattern B1.

The first metal terminal 50 has a first capacitor connecting portion 51, first terminal portions 52a, 52b, and first intermediate portions 53a, 53b. The first capacitor connecting portion 51 is mechanically connected to the first terminal electrode 2. The first capacitor connecting portion 51 is shaped like a plate parallel to the substrate S.

The first terminal portions 52a, 52b are mechanically connected to the positive electrode land patterns A11, A12 formed on the substrate S, respectively. The first terminal portions 52a, 52b are each shaped like a plate parallel to the substrate S, and oppose the first capacitor connecting portion 51 when seen in a direction orthogonal to the substrate S.

The first intermediate portions 53a, 53b electrically connect the first capacitor connecting portion 51 to the first terminal portions 52a, 52b, respectively. The first intermediate portion 53a connects one end of the first capacitor connecting portion 51 and one end of the first terminal portion 52a to each other. The first intermediate portion 53b connects one end of the first capacitor connecting portion 51 and one end of the first terminal portion 52b to each other.

In the ceramic capacitor mounting structure in accordance with the sixth embodiment, the first capacitor connecting portion 51 of the first metal terminal 50 is mechanically connected to the first terminal electrode 2 of the ceramic capacitor C1. Since the first capacitor connecting portion 51 of the first metal terminal 50 and the substrate S are parallel to each other, vibrations of the ceramic capacitor C1 transmitted from the first terminal electrode 2 to the substrate S through the first metal terminal 50 are mainly those in directions perpendicular to the substrate S, whereas vibrations in directions parallel to the substrate S are restrained from propagating to the substrate S through the first metal terminal 50. Since vibrations dominating the sounding of the substrate S are those in directions parallel to the substrate S, the ceramic capacitor mounting structure in accordance with the sixth embodiment can reduce the sounding generated from the substrate S.

The ceramic capacitor C1 is just mounted to the substrate S through the metal terminal 50, whereby there is no need to provide new restrictions when designing the substrate S. Therefore, the ceramic capacitor mounting structure in accordance with the sixth embodiment can reduce the sounding without lowering the degree of freedom in designing.

The first capacitor connecting portion 51 and first terminal portions 52a, 52b of the first metal terminal 50 oppose each other when seen in a direction orthogonal to the substrate S. Therefore, the first metal terminal 50 has an elastic force, and absorbs vibrations of the ceramic capacitor C1. As a result, the sounding generated from the substrate S can be reduced more.

The ceramic capacitor C1 is mounted to the substrate S such that the opposing direction of first and second inner electrodes 11 to 14, 21 to 24 is parallel to the substrate S. In the case of such mounting, vibrations in the opposing direction of first and second inner electrodes 11 to 14, 21 to 24 are parallel to the first capacitor connecting portions 51, 61 of the first metal terminals 50, 60, and thus are hard to propagate through the metal terminals.

Though preferred embodiments of the present invention are explained in detail in the foregoing, the present invention is not limited to the above-mentioned embodiments and modified examples. For example, the number of first and second inner electrodes is not limited to their numbers mentioned above. The number of first and second terminal electrodes is not limited to their numbers mentioned above. The number of ceramic capacitors is not limited to their numbers mentioned above.

The forms of first and second metal terminals are not limited to those mentioned above, and may be such that the terminal portion and the intermediate portion are integrated (e.g., like a single plate), for example. Alternatively, the capacitor connecting portion and the terminal portion may be parallel to each other without having portions opposing each other.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A ceramic capacitor mounting structure for mounting a ceramic capacitor to a substrate formed with first and second land electrodes;
    the ceramic capacitor comprising:
    a ceramic sintered body;
    first and second inner electrodes arranged so as to oppose each other with a ceramic interposed therebetween in the ceramic sintered body;
    a first terminal electrode electrically connected to the first inner electrode and formed on an outer surface of the ceramic sintered body; and
    a second terminal electrode electrically connected to the second inner electrode and formed on an outer surface of the ceramic sintered body;
    wherein the first terminal electrode is electrically connected to the first land electrode formed on the substrate through a first metal terminal;
    wherein the second terminal electrode is electrically connected to the second land electrode formed on the substrate;
    wherein the first metal terminal has a first capacitor connecting portion mechanically connected to the first terminal electrode, a first terminal portion mechanically connected to the first land electrode, and a first intermediate portion connecting the first capacitor connecting portion and the first terminal portion to each other;
    wherein the first capacitor connecting portion of the first metal terminal is parallel to the substrate; and
    wherein all of the side faces of the ceramic capacitor which are perpendicular to the substrate are not covered by the first metal terminal at all.

2. A ceramic capacitor mounting structure according to claim 1, wherein the second terminal electrode is electrically connected to the second land electrode formed on the substrate through a second metal terminal;
    wherein the second metal terminal has a second capacitor connecting portion mechanically connected to the second terminal electrode, a second terminal portion mechanically connected to the second land electrode, and a second intermediate portion connecting the second capacitor connecting portion and the second terminal portion to each other; and
    wherein the second capacitor connecting portion of the second metal terminal is parallel to the substrate.

3. A ceramic capacitor mounting structure according to claim 1, wherein the first terminal portion of the first metal terminal is parallel to the substrate, and has a portion opposing the first capacitor connecting portion when seen in a direction orthogonal to the substrate.

4. A ceramic capacitor mounting structure according to claim 2, wherein the first terminal portion of the first metal terminal is parallel to the substrate, and has a portion opposing the first capacitor connecting portion when seen in a direction orthogonal to the substrate; and wherein the second terminal portion of the second metal terminal is parallel to the substrate, and has a portion opposing the second capacitor connecting portion when seen in a direction orthogonal to the substrate.

5. A ceramic capacitor mounting structure according to claim 1, including a plurality of ceramic capacitors;

wherein the first terminal electrode of each of the ceramic capacitors is electrically connected to the first land electrode formed on the substrate through the first metal terminal; and wherein the second terminal electrode of each of the ceramic capacitors is mounted to the substrate by being electrically connected to the second land electrode formed on the substrate.

6. A ceramic capacitor mounting structure according to claim 1, wherein the ceramic capacitor is mounted to the substrate such that the first and second inner electrodes oppose each other in a direction parallel to the substrate.

7. A ceramic capacitor comprising:

a ceramic sintered body;

first and second inner electrodes arranged so as to oppose each other with a ceramic interposed therebetween in the ceramic sintered body;

a first terminal electrode electrically connected to the first inner electrode and formed on an outer surface of the ceramic sintered body; and a second terminal electrode electrically connected to the second inner electrode and formed on an outer surface of the ceramic sintered body;

wherein a metal terminal is mechanically connected to the first terminal electrode;

wherein the metal terminal has a capacitor connecting portion mechanically connected to the first terminal electrode, a terminal portion parallel to the capacitor connecting portion, and an intermediate portion electrically connecting the capacitor connecting portion and the terminal portion to each other; and wherein the ceramic capacitor is mountable to a substrate such that the capacitor connecting portion of the metal terminal is parallel to the substrate.

* * * * *